US012601779B2

(12) United States Patent
Burke

(10) Patent No.: US 12,601,779 B2
(45) Date of Patent: Apr. 14, 2026

(54) DETERMINING A BACK DRILLING DEPTH FOR A PRINTED CIRCUIT BOARD USING A PRINTED CIRCUIT BOARD TEST COUPON

(71) Applicant: Sandisk Technologies, Inc, Milpitas, CA (US)

(72) Inventor: John Patrick Burke, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 196 days.

(21) Appl. No.: 18/504,413

(22) Filed: Nov. 8, 2023

(65) Prior Publication Data

US 2025/0147097 A1 May 8, 2025

(51) Int. Cl.
*G01R 31/28* (2006.01)

(52) U.S. Cl.
CPC ................................. *G01R 31/2806* (2013.01)

(58) Field of Classification Search
CPC ........ H05K 3/389; H05K 3/0047; H05K 3/42; H05K 1/036; H05K 3/4614; H05K 3/4623; H05K 2203/16; H05K 1/0268; H05K 3/429; H01R 4/04; G01R 31/2805; G01R 31/2818; G01R 31/2801; G01R 31/14; G01R 31/52; G01B 7/066; G01B 7/26; G01B 15/02
See application file for complete search history.

(56) References Cited

U.S. PATENT DOCUMENTS

| | | | | | |
|---|---|---|---|---|---|
| 4,510,446 | A | * | 4/1985 | Braun ................ | G01R 31/2805 324/763.01 |
| 6,670,816 | B2 | * | 12/2003 | Kim .................... | G01R 27/2617 174/250 |
| 9,341,670 | B2 | * | 5/2016 | Bartley ................ | H05K 3/0047 |
| 9,354,270 | B2 | * | 5/2016 | Moran .................... | G01B 5/066 |
| 9,372,227 | B2 | * | 6/2016 | Wang ................ | G01R 31/2889 |
| 9,506,974 | B2 | * | 11/2016 | Lai ............................ | G01R 1/30 |
| 10,379,153 | B1 | * | 8/2019 | Neves ................ | G01R 31/2818 |
| 12,153,084 | B2 | * | 11/2024 | Thompson ............. | H05K 3/429 |

* cited by examiner

*Primary Examiner* — Vinh P Nguyen
(74) *Attorney, Agent, or Firm* — DENTONS Durham Jones Pinegar

(57) ABSTRACT

A PCB test coupon is used to determine a back drilling depth to remove a stub from a PCB. A number of conductors are placed at various layers within the PCB test coupon. Vias connect each end of a conductor to a surface layer of the PCB test coupon and form test points on the surface layer of the PCB test coupon. To determine a depth of each conductor, an inductive test probe is placed on the surface layer of the PCB test coupon. The inductive test probe generates and emits an alternating magnetic field which acts on the conductors and causes a crosstalk voltage to occur across the test points. The voltage across the test points is proportional to the distance of the conductors in each layer of the PCB test coupon.

20 Claims, 6 Drawing Sheets

300

310        320        330

| VOLTAGE | LAYER | DEPTH |
|---------|-------|-------|
| A | 1 | 200 μm |
| B | 2 | 175 μm |
| C | 3 | 125 μm |
| D | N-1 | 80 μm |
| E | N | 30 μm |

PLACE PROBE ON TOP SURFACE OF
PCB TEST COUPON                          410

PROVIDE CURRENT TO PROBE TO
GENERATE MAGNETIC FIELD                 420

MEASURE VOLTAGE ACROSS TEST
POINTS ON TOP SURFACE OF PCB
TEST COUPON                              430

ASSOCIATE VOLTAGE WITH DEPTH
MEASUREMENT                              440

610 — PROCESSING UNIT

620 — SYSTEM MEMORY

630 — OPERATING SYSTEM

640 — PROGRAM MODULES

650 — CONTROL SYSTEM

660 — REMOVABLE STORAGE

670 — NON-REMOVABLE STORAGE

680 — COMMUNICATION SYSTEMS

685 — INPUT/OUTPUT DEVICES

690 — SENSOR(S)

600 — COMPUTING DEVICE

695 — OTHER COMPUTING DEVICES

DETERMINING A BACK DRILLING DEPTH FOR A PRINTED CIRCUIT BOARD USING A PRINTED CIRCUIT BOARD TEST COUPON

BACKGROUND

A via is a conductive pathway that connects different layers of a printed circuit board (PCB). A stub of the via is an unused or undesired portion of the via that extends beyond a desired layer or termination point within the PCB. Via stubs may cause signal integrity issues due to signal reflections reflecting back from an open end of the stub.

Back drilling is a process that is used to drill out, or remove, the unwanted stub. For example, during a back drilling process, candidate vias are identified and a drilling depth for each candidate via is determined. The drilling depth is typically based on a conservative estimate of the depth of the via. For example, the drilling depth is based on the PCB stack up, a press cycle of the PCB, and properties of the prepreg of the PCB. In other examples, the drilling depth is determined by an x-ray drilling machine. The x-ray drilling machine controls the drilling depth in real-time based on an x-ray image.

The first method typically leaves a stub that may still impact signal integrity, especially at higher frequencies. The x-ray method involves using expensive, highly specialized machinery, which is generally unavailable in many multi-layer PCB fabrication plants.

Accordingly, it would be beneficial to accurately determine a back drilling depth for a PCB without using a conservative depth estimate and without the use of an x-ray machine.

SUMMARY

The present disclosure describes determining a back drilling depth to remove a stub from a PCB during a back drilling process. In an example, the back drilling depth is determined using a PCB test coupon that is associated with the PCB. The PCB test coupon includes a number of conductors placed at various layers within the PCB test coupon. Vias bring each end of a conductor to a surface layer of the PCB and form test points on the surface layer of the PCB test coupon. An inductive test probe is placed on the surface layer of the PCB test coupon. The inductive test probe generates and emits an alternating magnetic field which acts on the conductors embedded within the PCB test coupon.

As the magnetic field interacts with the conductor and the vias, a crosstalk voltage occurs across the test points on the surface layer of the PCB test coupon. The voltage across the test points is proportional to the distance of each of the conductors in each layer of the PCB test coupon. Thus, the closer the layer and conductor is to the surface layer of the PCB test coupon, the higher the voltage reading across the test points. The measurements, converted to depth from the surface layer, can then be used during the PCB back drilling process.

Accordingly, examples of the present disclosure describe a PCB test coupon that includes a first layer and a second layer positioned beneath the first layer. In an example, the second layer includes a conductor. A first via extends from a top surface of the first layer to a first side of the conductor. Additionally, a portion of the first via on the top surface of the first layer forms a first test point. A second via extends from the top surface of the first layer to a second side of the conductor. In an example, a portion of the second via on the top surface of the first layer forms a second test point. A voltage reading across the first test point and the second test point is associated with a depth of the conductor.

Examples of the present disclosure also describe a method that includes placing a probe on a top surface of PCB test coupon. A current is passed through the probe. A signal between a first test point on the top surface of the PCB test coupon and a second test point on the top surface of the PCB test coupon is determined. In an example, the first test point is associated with a first via that extends from the top surface of the PCB to a first side of a conductor on a first layer of the PCB test coupon and the second test point is associated with a second via that extends from the top surface of the PCB test coupon to a second side of the conductor on the first layer of the PCB test coupon. A back drilling depth associated with the first layer is then determined and is based, at least in part, on the signal between the first test point and the second test point.

The present application also describes a method that includes placing a probe on a top surface of a PCB test coupon. In an example, the PCB test coupon is associated with a PCB. A back drilling depth for a via associated with a first layer of the PCB is determined. In an example, the back drilling depth is determined by passing a current through the probe and determining a strength of a signal between a first test point on the top surface of the PCB test coupon and a second test point on the top surface of the PCB test coupon. The first test point is associated with a first via that extends from the top surface of the PCB test coupon to a first side of a conductor on a first layer of the PCB test coupon and the second test point is associated with a second via that extends from the top surface of the PCB test coupon to a second side of the conductor on the first layer of the PCB test coupon. The back drilling depth is identified by comparing the strength of the signal to a depth characterization table associated with the PCB. A back drilling process commences in which the via associated with the first layer of the PCB is back drilled to the back drilling depth.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

FIG. 3 illustrates a depth to voltage characterization table according to an example.

DETAILED DESCRIPTION

Figure 1A:
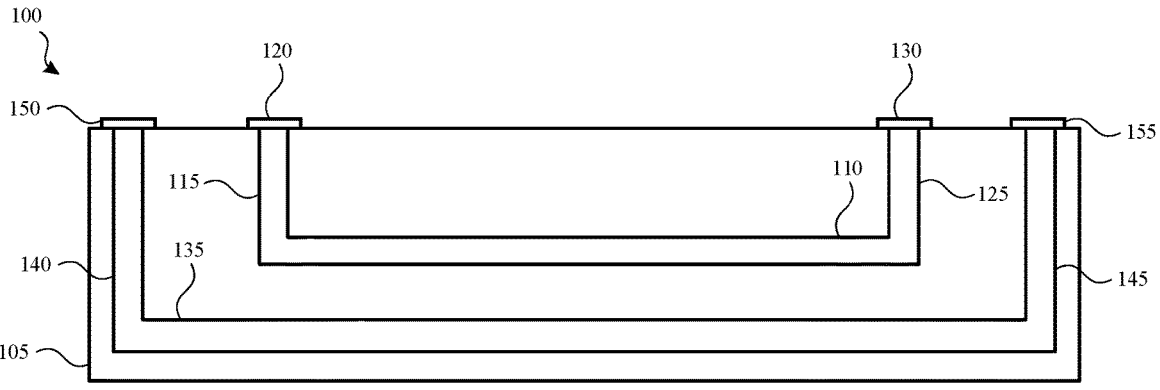
FIG. 1A illustrates a printed circuit board (PCB) test coupon that is used to determine a back drilling depth to remove a stub from an associated PCB according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

As previously discussed, a via is a conductive pathway that connects different layers of a printed circuit board (PCB). A stub of the via is an unused portion of the via that extends into another layer of the PCB. Stubs are problematic in that they can cause signal integrity issues due to signal reflections reflecting back from an open end of the stub.

Stubs are typically eliminated from a PCB using a back drilling process. For example, when a via with a stub is identified, a drilling depth for the via is determined. The drilling depth is typically based on an estimate of the depth of the via. In an example, the depth of the via is based on the PCB stack up, a press cycle of the PCB, and/or properties of the prepreg of the PCB. In other examples, the drilling depth is determined in real-time using an x-ray drilling machine.

However, each of these solutions are problematic. For example, estimating the depth of the via typically leaves a stub that may still impact signal integrity. X-ray machines are highly specialized and expensive and aren't widely available in many multi-layer PCB fabrication plants.

In order to address the above, the present disclosure describes using a PCB test coupon to determine a depth of each layer in an associated PCB. In an example, the PCB test coupon is placed on, or is otherwise part of, a PCB panel waste area. Thus, the structure and layout of the PCB test coupon is similar to the structure and layout of the PCB.

The PCB test coupon includes a number of conductors placed at various layers within the PCB test coupon. Vias bring each end of a conductor to a surface layer of the PCB test coupon to form test points on the surface layer of the PCB test coupon. To determine a depth of each conductor, an inductive test probe is placed on the surface layer of the PCB test coupon. The inductive test probe generates and emits an alternating magnetic field which acts on the conductors embedded within each layer of the PCB test coupon. As the magnetic field interacts with the conductor and the vias, a crosstalk voltage occurs across the test points on the surface layer of the PCB. The voltage across the test points is proportional to the distance of the conductors in each layer of the PCB test coupon. Thus, the closer the layer and conductor is to the surface layer of the PCB test coupon, the higher the voltage reading across the test points. The measurements, converted to depth from the surface layer, can then be used during the PCB back drilling process.

Accordingly, many technical benefits may be realized including, but not limited to, accurately and efficiently determining a back drilling depth to remove stubs from a PCB, reducing or eliminating the risk of over drilling, and reducing or eliminating the risk of broken/waste PCB boards due to over drilling.

These and other examples will be shown and described in greater detail with respect to FIG. 1A-FIG. 6.

FIG. 1A illustrates a printed circuit board (PCB) test coupon 100 that is used to determine a back drilling depth to remove a stub from an associated PCB according to an example. In an example, the PCB test coupon 100 is part of a working panel of a PCB. For example, the PCB test coupon 100 may be provided on an outer edge, or a panel waste area, of the PCB working panel. Thus, the structure and layout of the PCB test coupon 100 is similar to the structure and layout of each PCB that is fabricated as part of the PCB working panel.

In an example, the PCB test coupon 100 includes a prepreg 105 and multiple layers. For example, the PCB test coupon 100 may include one or more prepreg layers and one or more copper layers. In the example shown, the PCB test coupon 100 includes two layers. Although two layers are described, the PCB test coupon 100 and the associated PCB may have any number of layers.

Each layer of the PCB test coupon 100 includes a conductor. For example, the first layer of the PCB test coupon 100 includes a first conductor 110 and the second layer of the PCB test coupon 100 includes a second conductor 135. In an example, the first conductor 110 and the second conductor 135 are comprised of copper. Although copper is specifically mentioned, other materials may be used.

The first conductor 110 of the first layer of the PCB test coupon 100 includes a first via 115 and a second via 125. The first via 115 extends from a first side of the first conductor 110 to a top surface of the PCB test coupon 100 and forms a first test point 120. Likewise, the second via 125 extends from a second side of the first conductor 110 to the top surface of the PCB test coupon 100 and forms a second test point 130.

As will be described in greater detail with respect to FIG. 1B, when a test probe is placed on the top surface of the PCB test coupon 100 and generates a magnetic field, a voltage will be generated across the first test point 120 and the second test point 130. A strength or value of a voltage reading across the first test point 120 and the second test point 130 will be proportional to a depth the first conductor 110.

As discussed, the PCB test coupon 100 also includes a second conductor 135 provided on, or otherwise associated with a second layer of the PCB test coupon 100. The second conductor 135 of the second layer of the PCB test coupon 100 includes a third via 140 and a fourth via 145. The third via 135 extends from a first side of the second conductor 135 to a top surface of the PCB test coupon 100 and forms a third test point 150. Likewise, the fourth via 145 extends from a second side of the second conductor 135 to the top surface of the PCB test coupon 100 and forms a fourth test point 155.

Just like the first test point 120 and the second test point 130, a voltage will be generated across the third test point 150 and the fourth test point 155 when the test probe generates the magnetic field. A strength or value of a voltage reading across the third test point 150 and the fourth test point 155 will be proportional to a depth the second conductor 135.

Figure 1B:
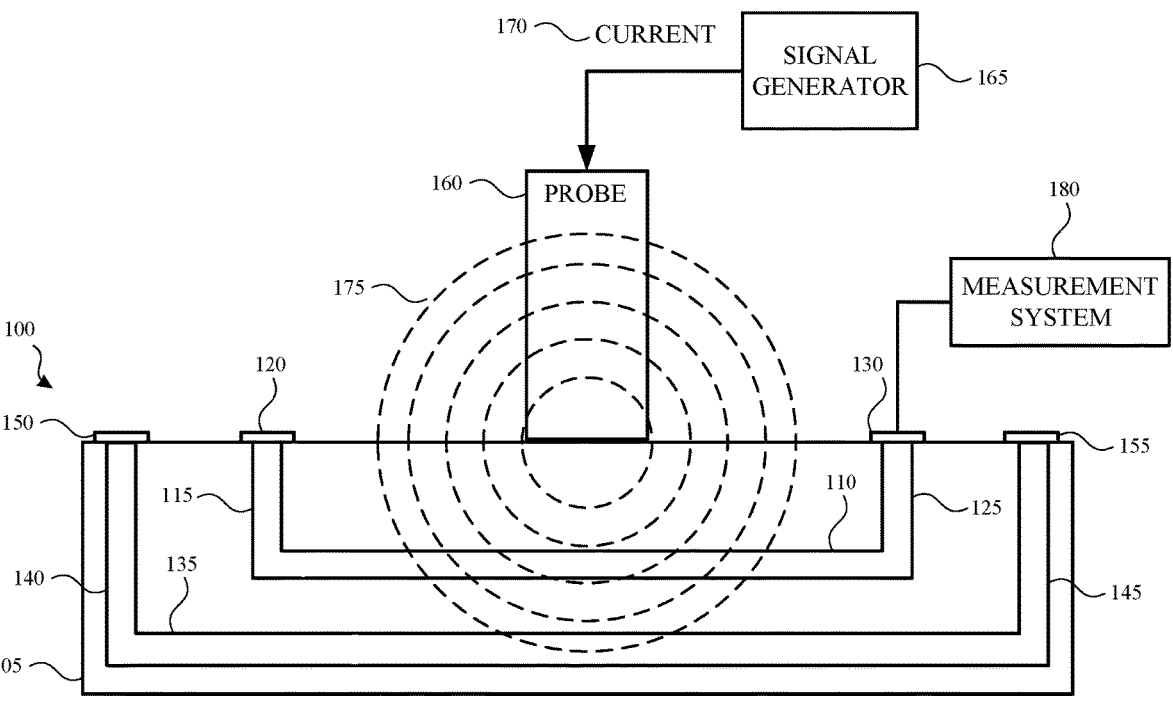
FIG. 1B illustrates a probe being placed on the top surface of the PCB test coupon shown and described with respect to FIG. 1A according to an example.

FIG. 1B illustrates a probe 160 being placed on the top surface of the PCB test coupon 100 shown and described with respect to FIG. 1A according to an example. In an example, the probe 160 is an inductive prove that includes a magnetic coil. A signal generator 165 applies a current 170 (e.g., an alternating current) to the probe 160. The frequency of the current 170 may change based on a number of factors. In an example, the factors include, but are not limited to, a design of the PCB test coupon and a type of materials used in the PCB test coupon. As the current 170 passes through the magnetic coil a magnetic field 175 is generated.

The magnetic field 175 affects or otherwise interacts with the first conductor 110 and generates a crosstalk voltage across the first test point 120 and the second test point 130. The magnetic field 175 also affects or otherwise interacts with the second conductor 135 and generates a crosstalk voltage across the third test point 150 and the fourth test point 155. In an example, a measurement system 180 is used to determine the voltage across the first test point 120 and the second test point 120. The measurement system 180 may also be used to determine the voltage across the third test point 150 and the fourth test point 155.

The voltage that is measured by the measurement system 180 is proportional to the depth of each conductor. For example, the stronger the voltage, the closer the conductor to the top surface of the PCB test coupon 100.

Figure 2:
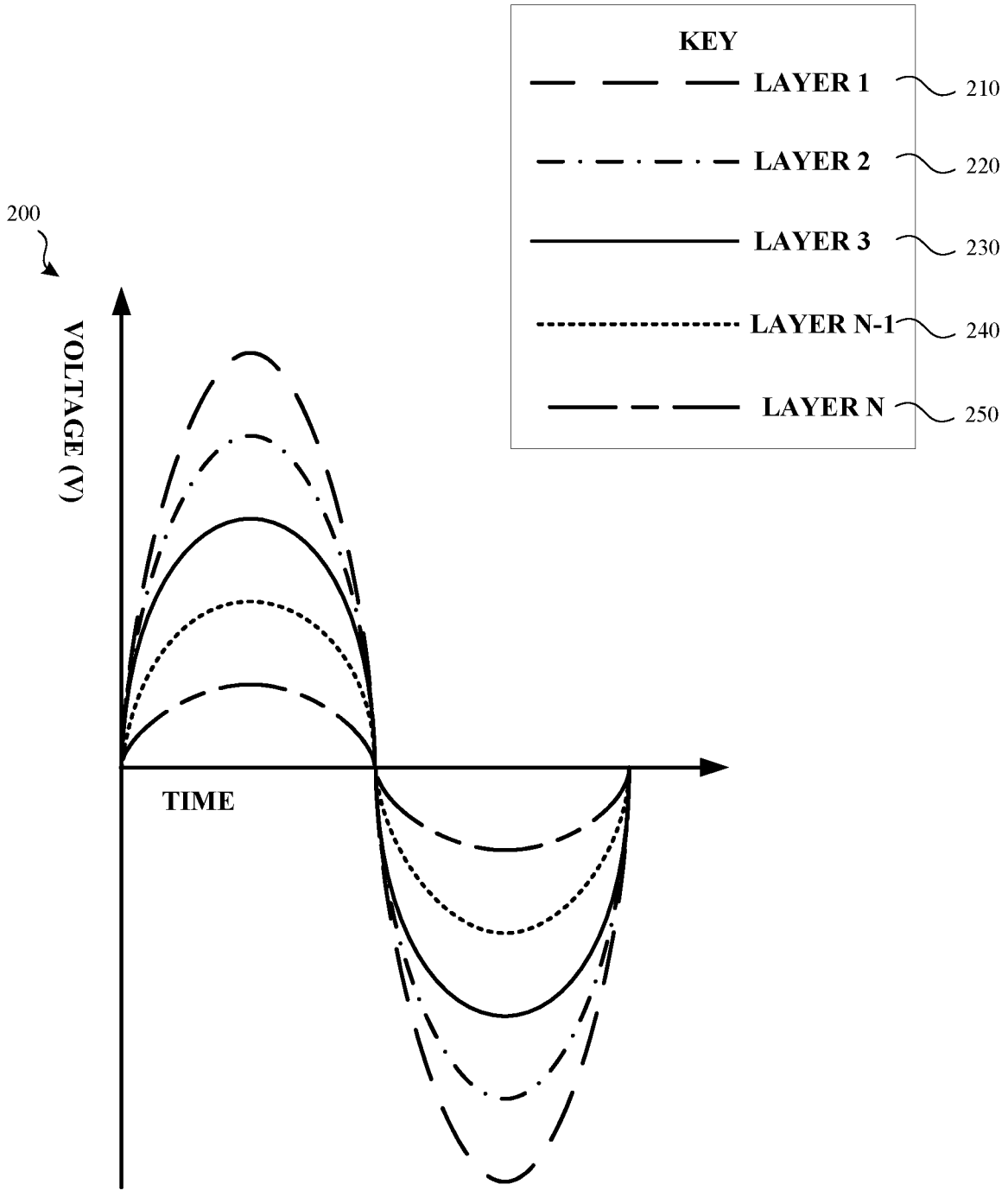
FIG. 2 illustrates a graph that shows how a voltage across various test points on a PCB test coupon is proportional to a depth of conductors in the PCB test coupon according to an example.

FIG. 2 illustrates a graph 200 that shows how a voltage across various test points on a PCB test coupon is proportional to a depth of conductors in the PCB test coupon according to an example. Although sinusoidal waveforms are shown in FIG. 2, the waveforms in the graph 200 may be pulse waveforms, square waveforms or other types of waveforms. In an example, the type of waveform may be based, at least in part, on a design of the PCB and/or the PCB test coupon.

In an example, the voltages represented in the graph 200 are taken by a measurement system that is coupled to various test points on a PCB test coupon. In the example of FIG. 2, the PCB test coupon includes N layers. As such, the measurement system has taken measurements relating to Layer 1 210, Layer 2 220, Layer 3 230 Layer N–1 240 and Layer N 250.

As previously explained, the voltage across the test points is proportional to the depth of each conductor or layer. Thus, the higher the voltage, the closer the layer to the top surface of the PCB test coupon. As shown in the graph 200, because test points associated with Layer 1 210 have the highest voltage, Layer 1 210 is the closest to the top surface of the PCB test coupon. Similarly, because test points associated with Layer N 250 have the lowest voltage, Layer N is farthest away from the top surface of the PCB test coupon.

Although the voltage across the various test points are proportional to the depth of each conductor, it may be beneficial to characterize a particular voltage (or a range of voltages) to a particular depth in the PCB or PCB test coupon. As such, when a PCB is fabricated, the PCB test coupon 100 (or another PCB test coupon associated with the PCB) may be sectioned to show an exact height of the copper at every layer in the PCB. A height measurement of the copper at every layer in the PCB can then be taken and associated with a corresponding voltage level.

FIG. 3 illustrates a depth to voltage characterization table 300 according to an example. In an example, a characterization table 300 is unique to a particular PCB/PCB test coupon design. Thus, a first PCB design is associated with one characterization table 300 while a second PCB design is associated with a second characterization table.

In an example, the characterization table 300 includes a voltage column 310, a layer column 320 and a depth column 330. Although three columns are identified, the characterization table 300 may include more columns or fewer columns. The values in each column are determined or generated using a PCB test coupon, such as, for example, the PCB test coupon 100 shown and described with respect to FIG. 1A and FIG. 1B.

For example, when a test probe is applied to the PCB test coupon and a magnetic field is generated, a measurement system determines a voltage 310 across different test points associated with each layer 320. The voltage 310 for each layer 320 is then associated with a depth 330. For example and as previously discussed, when a PCB is fabricated, the PCB test coupon is sectioned to show an exact height of the copper at every layer 320 in the PCB. The height measurement of the copper at every layer 320 is then associated with a corresponding voltage 310.

During a PCB back drilling process, the test probe is applied to the PCB test coupon and a magnetic field is generated. The measurement system determines the voltage 310 across the test points associated with a particular layer 320. When the voltage 310 is determined, the drilling depth 330 is determined using the characterization table 300. For example, during a back drilling process, the measurement system determines that a first test point and second test point are associated with a voltage A. As such, the back drilling depth of Layer 1 is 200 microns (µm). Likewise, during the back drilling process, the measurement system determines that voltage B is associated with a third test point and a fourth test point associated with Layer 2. Based on the characterization table, Voltage B indicates that the back drilling depth 330 of Layer 2 is 175 µm.

Figure 4:
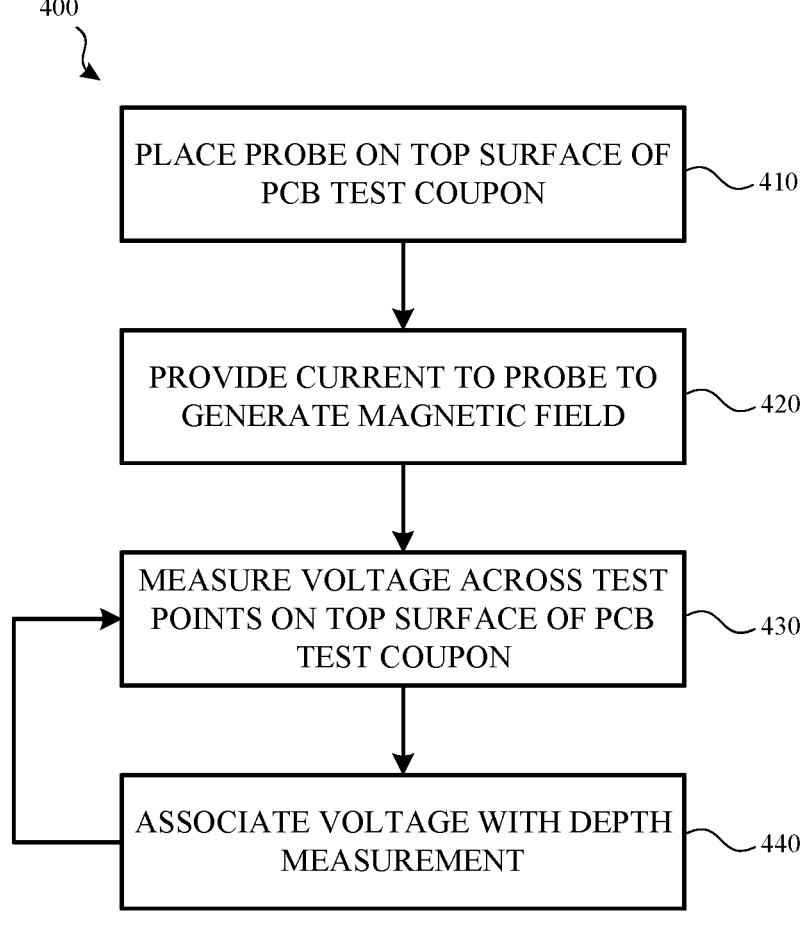
FIG. 4 illustrates a method for determining a back drilling depth to remove a stub from a PCB using a PCB test coupon according to an example.

FIG. 4 illustrates a method 400 for determining a back drilling depth to remove a stub from a PCB using a PCB test coupon according to an example. In an example, the method 400 may be performed using a PCB test coupon, a probe, a signal generator and/or a measurement system. For example, the method 400, or portions of the method 400 may be performed using the PCB test coupon 100, the probe 160, the signal generator 165 and/or a measurement system 180 shown and described with respect to FIG. 1B.

Method 400 begins when the probe is placed (410) on a top surface of the PCB test coupon. In an example, the PCB test coupon includes a first test point and a second test point on a top surface. Additionally, the first test point is associated with a first via that extends from the top surface of the PCB test coupon to a first side of a conductor that is provided on or otherwise associated with a first layer of the PCB test coupon. The second test point is associated with a second via that extends from the top surface of the PCB test coupon to a second side of the conductor.

When the probe has been placed on the top surface of the PCB test coupon, a current is provided (420) to the probe, which causes the probe to generate a magnetic field. A measurement system measures (430) the voltage across the first test point and the second test point on the top surface of the PCB test coupon.

When the measurement is taken, the voltage is associated (440) with a depth measurement. In an example, the depth measurement and voltage measurement may be used to populate a characterization table, such as, for example, the characterization table 300 shown and described with respect to FIG. 3. Operations 430 and 440 may then be repeated for other test points and associated layers in the PCB test coupon. In another example, the voltage measurements for other test points may occur at the same time or at a similar time to the measurements taken across the first test point and the second test point.

Figure 5:
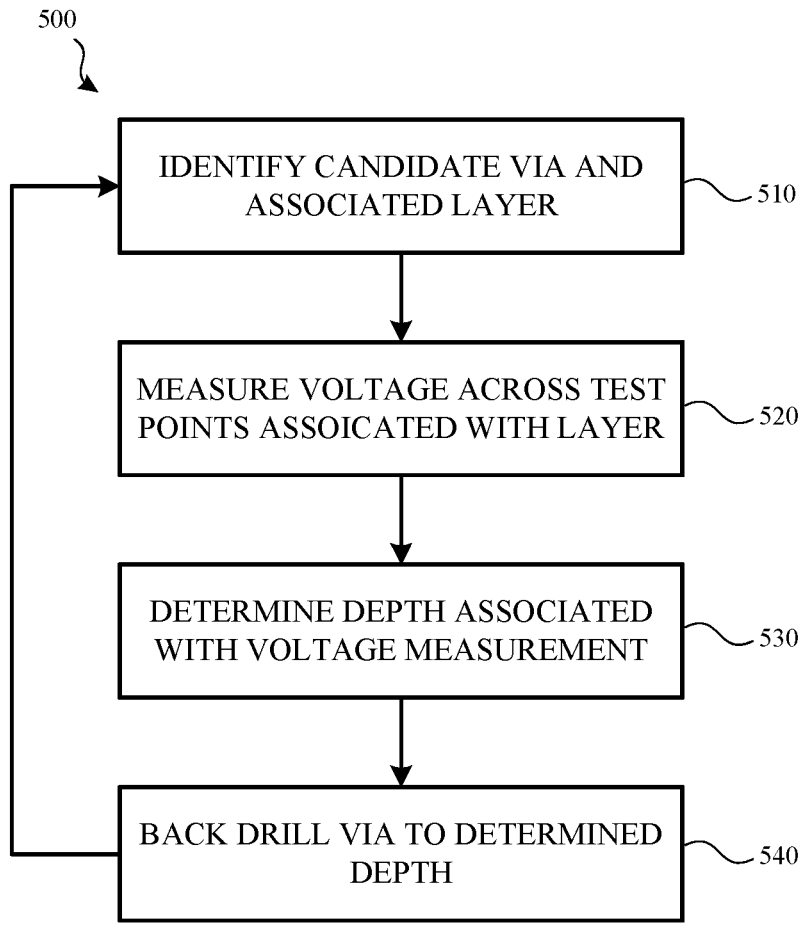
FIG. 5 illustrates a method of performing a back drilling process on a PCB using a depth that is determined by a PCB test coupon according to an example.

FIG. 5 illustrates a method 500 of performing a back drilling process on a PCB using a depth that is determined by a PCB test coupon according to an example. In an example, the method 500 may be performed using a PCB test coupon that is associated with the PCB, a probe, a signal generator, a measurement system and/or a drill. For example, the method 500, or portions of the method 500 may be performed using the PCB test coupon 100, the probe 160, the signal generator 165 and/or the measurement system 180 shown and described with respect to FIG. 1B. Additionally, the voltage measurements and the associated depth determination may be made and/or determined during a back drilling process that is used to remove stubs from a PCB that is associated with the PCB test coupon.

Method 500 begins when a candidate via and an associated layer of a PCB are identified (510). In an example, the candidate via is a via that includes a stump that should be removed by a back drilling process. When the candidate via is identified, a layer at which the via is supposed to terminate may also be identified.

When the candidate via and the associated layer have been identified, a probe provided on a top surface the PCB test coupon generates a magnetic field that interacts with a conductor in a layer of the PCB test coupon that corresponds to the layer of the PCB at which the via is supposed to terminate. A measurement system measures (520) the voltage across at least two test points that are associated with the conductor.

The measurement system may then compare the voltage with a depth measurement provided in a characterization table associated with the PCB to determine (530) a back drilling depth. A drill may then be used to back drill (540) the via to the determined depth.

Figure 6:
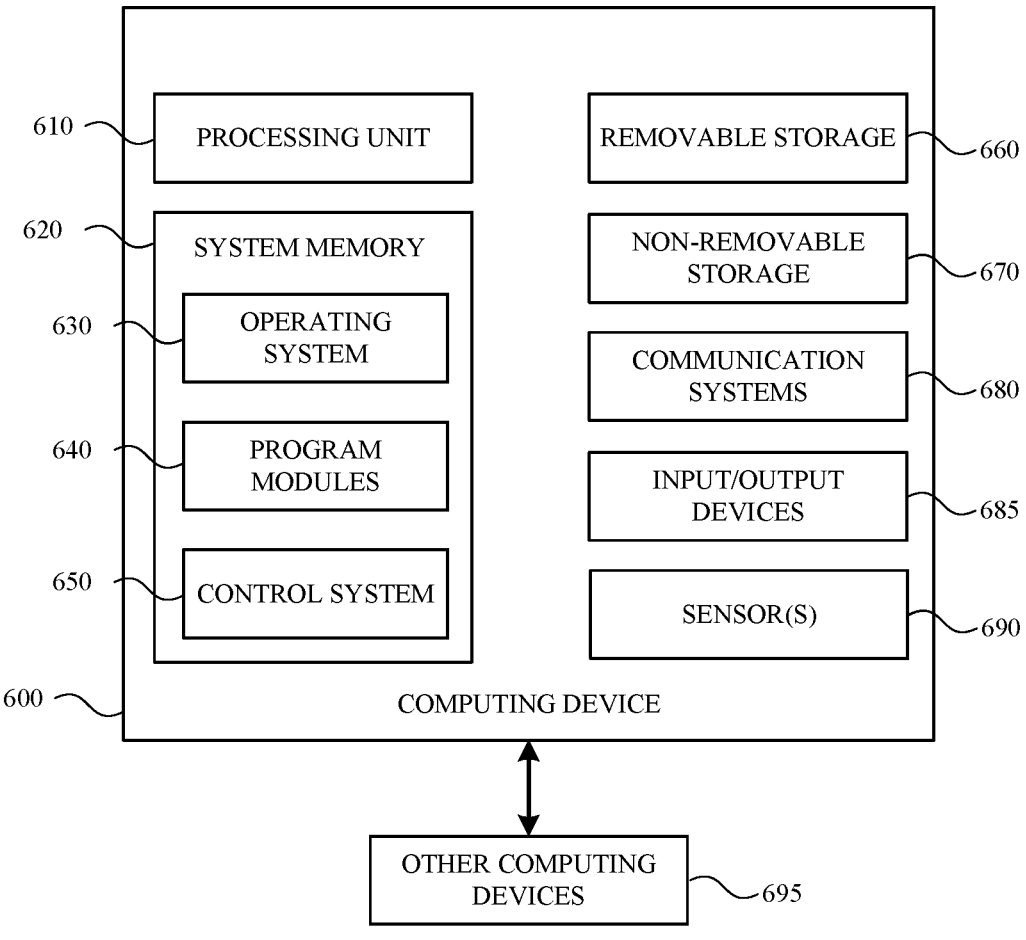
FIG. 6 is a system diagram of a computing device according to an example.

FIG. 6 is a system diagram of a computing device 600 according to an example. The computing device 600, or various components and systems of the computing device 600, may be integrated or associated with a back drilling machine, a measurement system (e.g., the measurement system 180 (FIG. 1B)), a probe (e.g., the probe 160 (FIG. 1B)) and/or a measurement system (e.g., the measurement system 180 (FIG. 1B)) that are shown and described with respect to the various examples described herein.

For example, the computing device 600, or various components or systems of the computing device 600, may be used to determine a voltage across various test points on a top surface of a PCB test coupon, associate the voltage measurements with a depth of a particular layer in a PCB and/or control a back drilling process performed by a back drilling machine.

As shown in FIG. 6, the physical components (e.g., hardware) of the computing device are illustrated and these physical components may be used to practice the various aspects of the present disclosure.

The computing device 600 may include at least one processing unit 610 and a system memory 620. The system memory 620 may include, but is not limited to, volatile storage (e.g., random access memory), non-volatile storage (e.g., read-only memory), flash memory, or any combination of such memories. The system memory 620 may also include an operating system 630 that controls the operation of the computing device 600 and one or more program modules 640. The program modules 640 and/or a control system 650, may be responsible for executing one or more operations corresponding to measuring a voltage across test points, applying a particular current to a probe, associating a voltage with a depth and/or controlling a drilling depth of a drill during a back drilling process. While being executed by the processing unit 610, the program modules 640 may perform the various processes described above.

The computing device 600 may also have additional features or functionality. For example, the computing device 600 may include additional data storage devices (e.g., removable and/or non-removable storage devices) such as, for example, magnetic disks, optical disks, or tape. These additional storage devices are labeled as a removable storage 660 and a non-removable storage 670.

Examples of the disclosure may also be practiced in an electrical circuit comprising discrete electronic elements, packaged or integrated electronic chips containing logic gates, a circuit utilizing a microprocessor, or on a single chip containing electronic elements or microprocessors. For example, examples of the disclosure may be practiced via a system-on-a-chip (SOC) where each or many of the components illustrated in FIG. 6 may be integrated onto a single integrated circuit. Such a SOC device may include one or more processing units, graphics units, communications units, system virtualization units and various application functionality all of which are integrated (or "burned") onto the chip substrate as a single integrated circuit.

When operating via a SOC, the functionality, described herein, may be operated via application-specific logic integrated with other components of the computing device 600 on the single integrated circuit (chip). The disclosure may also be practiced using other technologies capable of performing logical operations such as, for example, AND, OR, and NOT, including but not limited to, mechanical, optical, fluidic, and quantum technologies.

The computing device 600 may include one or more communication systems 680 that enable the computing device 600 to communicate with other computing devices 695 or systems, such as, for example, a measurement system, a signal generator, and/or a back drill. Examples of communication systems 680 include, but are not limited to, wireless communications, wired communications, cellular communications, radio frequency (RF) transmitter, receiver, and/or transceiver circuitry, a Controller Area Network (CAN) bus, a universal serial bus (USB), parallel, serial ports, etc.

The computing device 600 may also have one or more input devices and/or one or more output devices shown as input/output devices 685. These input/output devices 685 may include a keyboard, a sound or voice input device, haptic devices, a touch, force and/or swipe input device, a display, speakers, etc. The aforementioned devices are examples and others may be used.

The computing device 600 may also include one or more sensors 690. The sensors may be image sensors, depth sensors, voltage sensors, or any other device that receives or takes a measurement.

The term computer-readable media as used herein may include computer storage media. Computer storage media may include volatile and nonvolatile, removable and non-removable media implemented in any method or technology for storage of information, such as computer readable instructions, data structures, or program modules.

The system memory 620, the removable storage 660, and the non-removable storage 670 are all computer storage media examples (e.g., memory storage). Computer storage media may include RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other article of manufacture which can be used to store information and which can be accessed by the computing device 600. Any such computer storage media may be part of the computing device 600. Computer storage media does not include a carrier wave or other propagated or modulated data signal.

Based on the above, examples of the present disclosure describe a printed circuit board (PCB) test coupon, comprising: a first layer; a second layer positioned beneath the first layer and comprising a conductor; a first via extending from a top surface of the first layer to a first side of the conductor, wherein a portion of the first via on the top surface of the first layer forms a first test point; and a second via extending from the top surface of the first layer to a second side of the conductor, wherein a portion of the second via on the top surface of the first layer forms a second test point and wherein a voltage reading across the first test point and the second test point is associated with a depth of the conductor. In an example, the conductor is a first conductor and wherein the PCB test coupon further comprises: a third layer comprising a second conductor, the third layer positioned beneath the first layer and the second layer; a third via extending from the top surface of the first layer to a first side of the second conductor, wherein a portion of the third via on the top surface of the first layer forms a third test point; and a second via extending from the top surface of the first layer to a second side of the conductor, wherein a portion of the second via on the top surface of the first layer forms a fourth test point and wherein a voltage reading across the third test point and the fourth test point is associated with a depth of the second conductor. In an example, the voltage reading is associated with a magnetic field generated by an inductive probe placed on the first layer. In an example, a frequency of a signal provided to the inductive probe is based, at least in part, on a design of the PCB test coupon. In an example, the depth of the conductor indicates a drilling depth of back drilling process to be performed on a PCB associated with the PCB test coupon.

Other examples describe a method, comprising: placing probe on a top surface of printed circuit board (PCB) test coupon; passing a current through the probe; determining a signal between a first test point on the top surface of the PCB test coupon and a second test point on the top surface of the PCB test coupon, the first test point being associated with a first via that extends from the top surface of the PCB to a first side of a conductor on a first layer of the PCB test coupon and the second test point being associated with a second via that extends from the top surface of the PCB test coupon to a second side of the conductor on the first layer of the PCB test coupon; and determining, based at least in part, on the signal between the first test point and the second test point, a back drilling depth associated with the first layer. In an example, the probe is an inductive probe. In an example, the current is an alternating current. In an example, the signal is a voltage reading and wherein a value of the voltage reading is proportional to a depth of the conductor on the first layer of the PCB. In an example, the method also includes determining a signal between a third test point on the top surface of the PCB test coupon and a fourth test point on the top surface of the PCB test coupon, the third test point being associated with a third via that extends from the top surface of the PCB to a first side of a conductor on a second layer of the PCB test coupon and the fourth test point being associated with a fourth via that extends from the top surface of the PCB test coupon to a second side of the conductor on the second layer of the PCB test coupon; and determining, based at least in part, on the signal between the third test point and the fourth test point, a back drilling depth associated with at least one of the third via and the fourth via. In an example, a waveform of the current is based, at least in part, on a design of the PCB test coupon. In an example, a frequency of the current is based, at least in part, on a design of the PCB test coupon. In an example, the method also includes generating a characterization table for the PCB test coupon based, at least in part, on the signal between the first test point and the second test point and a depth of the conductor.

Additional examples describe a method, comprising: placing a probe on a top surface of a printed circuit board (PCB) test coupon, the PCB test coupon being associated with a PCB; determining a back drilling depth for a via associated with a first layer of the PCB, the back drilling depth being determined by: passing a current through the probe; determining a strength of a signal between a first test point on the top surface of the PCB test coupon and a second test point on the top surface of the PCB test coupon, the first test point being associated with a first via that extends from the top surface of the PCB test coupon to a first side of a conductor on a first layer of the PCB test coupon and the second test point being associated with a second via that extends from the top surface of the PCB test coupon to a second side of the conductor on the first layer of the PCB test coupon; and identifying the back drilling depth by comparing the strength of the signal to a depth characterization table associated with the PCB; and back drilling the via associated with the first layer of the PCB to the back drilling depth. In an example, the probe is an inductive probe. In an example, the current is an alternating current. In an example, the signal is a voltage reading and wherein a value of the voltage reading is proportional to a depth of the conductor on the first layer of the PCB test coupon. In an example, the method also includes determining a back drilling depth for a via associated with a second layer of the PCB, the back drilling depth for the via associated with the second layer being determined by: passing a current through the probe; determining a strength of a signal between a third test point on the top surface of the PCB test coupon and a fourth test point on the top surface of the PCB test coupon, the third test point being associated with a third via that extends from the top surface of the PCB test coupon to a first side of a conductor on a second layer of the PCB test coupon and the fourth test point being associated with a fourth via that extends from the top surface of the PCB test coupon to a second side of the conductor on the second layer of the PCB test coupon; and identifying the back drilling depth by comparing the strength of the signal to a depth characterization table associated with the PCB; and back drilling the via associated with the second layer of the PCB to the back drilling depth. In an example, a waveform of the current is based, at least in part, on a design of the PCB test coupon. In an example, a frequency of the current is based, at least in part, on a design of the PCB test coupon.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks. Additionally, it is contemplated that the flowcharts and/or aspects of the flowcharts may be combined and/or performed in any order.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A printed circuit board (PCB) test coupon, comprising:
a first layer comprising a first conductor;
a second layer positioned beneath the first layer and comprising a second conductor;
a first via extending from a top surface of the first layer to a first side of the first conductor;
a first test point provided on the top surface of the first layer and associated with the first via;
a second via extending from the top surface of the first layer to a second side of the first conductor; and
a second test point provided on the top surface of the first layer and associated with the second via, wherein when an inductive probe is placed on the top surface of the first layer and a current is passed through the probe, a magnetic field is generated and a voltage reading across the first test point and the second test point is associated with a depth of the first conductor.

2. The PCB test coupon of claim 1, further comprising:
a third via extending from the top surface of the first layer to a first side of the second conductor;
a third test point provided on the top surface of the first layer and associated with the third via;

a fourth via extending from the top surface of the first layer to a second side of the second conductor; and
a fourth test point provided on the top surface of the first layer and associated with the fourth via, wherein when the inductive probe is placed on the top surface of the first layer and the current is passed through the inductive probe, the magnetic field is generated and a voltage reading across the third test point and the fourth test point is associated with a depth of the second conductor.

3. The PCB test coupon of claim 1, wherein a frequency of a signal provided to the inductive probe is based, at least in part, on a design of the PCB test coupon.

4. The PCB test coupon of claim 1, wherein the depth of at least one of the first conductor and the second conductor indicates a drilling depth of a back drilling process to be performed on a PCB associated with the PCB test coupon.

5. The PCB test coupon of claim 1, wherein a waveform of a signal provided to the inductive probe is based, at least in part, on a design of the PCB test coupon.

6. A method, comprising:
placing a probe on a top surface of a printed circuit board (PCB) test coupon;
passing a current through the probe;
determining a signal between a first test point on the top surface of the PCB test coupon and a second test point on the top surface of the PCB test coupon, the first test point being associated with a first via that extends from the top surface of the PCB test coupon to a first side of a first conductor on a first layer of the PCB test coupon and the second test point being associated with a second via that extends from the top surface of the PCB test coupon to a second side of the first conductor on the first layer of the PCB test coupon; and
determining, based at least in part, on the signal between the first test point and the second test point, a back drilling depth associated with at least one of the first via and the second via.

7. The method of claim 6, wherein the probe is an inductive probe.

8. The method of claim 6, wherein the current is an alternating current.

9. The method of claim 6, wherein the signal is a voltage reading and wherein a value of the voltage reading is proportional to a depth of the first conductor on the first layer of the PCB test coupon.

10. The method of claim 6, further comprising:
determining a signal between a third test point on the top surface of the PCB test coupon and a fourth test point on the top surface of the PCB test coupon, the third test point being associated with a third via that extends from the top surface of the PCB test coupon to a first side of a second conductor on a second layer of the PCB test coupon and the fourth test point being associated with a fourth via that extends from the top surface of the PCB test coupon to a second side of the second conductor on the second layer of the PCB test coupon; and
determining, based at least in part, on the signal between the third test point and the fourth test point, a back drilling depth associated with at least one of the third via and the fourth via.

11. The method of claim 6, wherein a waveform of the current is based, at least in part, on a design of the PCB test coupon.

12. The method of claim 6, wherein a frequency of the current is based, at least in part, on a design of the PCB test coupon.

13. The method of claim 6, further comprising generating a characterization table for the PCB test coupon based, at least in part, on the signal between the first test point and the second test point and a determined depth of the first conductor.

14. A method, comprising:

placing a probe on a top surface of a printed circuit board (PCB) test coupon, the PCB test coupon being associated with a PCB;

determining a back drilling depth for a via associated with a first layer of the PCB, the back drilling depth being determined by:

passing a current through the probe;

determining a strength of a signal between a first test point on the top surface of the PCB test coupon and a second test point on the top surface of the PCB test coupon, the first test point being associated with a first via that extends from the top surface of the PCB test coupon to a first side of a first conductor on a first layer of the PCB test coupon and the second test point being associated with a second via that extends from the top surface of the PCB test coupon to a second side of the first conductor on the first layer of the PCB test coupon; and identifying the back drilling depth by comparing the strength of the signal to a depth characterization table associated with the PCB; and back drilling the via associated with the first layer of the PCB to the back drilling depth.

15. The method of claim 14, wherein the probe is an inductive probe.

16. The method of claim 14, wherein the current is an alternating current.

17. The method of claim 14, wherein the signal is a voltage reading and wherein a value of the voltage reading is proportional to a depth of the first conductor on the first layer of the PCB test coupon.

18. The method of claim 14, further comprising:

determining a back drilling depth for a via associated with a second layer of the PCB, the back drilling depth for the via associated with the second layer being determined by:

passing a current through the probe;

determining a strength of a signal between a third test point on the top surface of the PCB test coupon and a fourth test point on the top surface of the PCB test coupon, the third test point being associated with a third via that extends from the top surface of the PCB test coupon to a first side of a second conductor on a second layer of the PCB test coupon and the fourth test point being associated with a fourth via that extends from the top surface of the PCB test coupon to a second side of the second conductor on the second layer of the PCB test coupon; and identifying the back drilling depth by comparing the strength of the signal to a depth characterization table associated with the PCB; and back drilling the via associated with the second layer of the PCB to the back drilling depth.

19. The method of claim 14, wherein a waveform of the current is based, at least in part, on a design of the PCB test coupon.

20. The method of claim 14, wherein a frequency of the current is based, at least in part, on a design of the PCB test coupon.

* * * * *